United States Patent [19]

Mori et al.

[11] Patent Number: 5,375,133
[45] Date of Patent: Dec. 20, 1994

[54] SURFACE EMITTING SEMICONDUCTOR LASER AND METHOD OF MANUFACTURE

[75] Inventors: Katsumi Mori; Tatsuya Asaka; Hideaki Iwano, all of Suwa, Japan

[73] Assignee: Seiko Epson Corporation, Tokyo, Japan

[21] Appl. No.: 206,104

[22] Filed: Mar. 3, 1994

Related U.S. Application Data

[63] Continuation of Ser. No. 952,492, Jan. 19, 1993, abandoned.

[30] Foreign Application Priority Data

Mar. 28, 1991 [JP] Japan ................................. 3-64872
Mar. 11, 1992 [JP] Japan ................................. 4-52642

[51] Int. Cl.$^5$ .......................... H01S 3/19; H01L 21/00
[52] U.S. Cl. ......................... 372/45; 372/46; 372/96; 437/129
[58] Field of Search .................. 372/45, 46, 50, 96, 372/92; 437/129

[56] References Cited

U.S. PATENT DOCUMENTS

| | | | |
|---|---|---|---|
| 4,949,350 | 8/1990 | Jewell et al. | 372/45 |
| 4,949,351 | 8/1990 | Imanaka | 372/45 |
| 5,115,441 | 5/1992 | Kopf et al. | 372/45 |
| 5,181,219 | 1/1993 | Mori et al. | 372/45 |
| 5,181,221 | 1/1993 | Mori et al. | 372/46 |
| 5,182,757 | 1/1993 | Mori et al. | 372/45 |

FOREIGN PATENT DOCUMENTS

| | | |
|---|---|---|
| 0098888 | 8/1981 | Japan . |
| 0142879 | 6/1988 | Japan . |
| 0264285 | 10/1989 | Japan . |
| 0018835 | 1/1991 | Japan . |
| 0280693 | 10/1992 | Japan . |

OTHER PUBLICATIONS

*Journal of Crystal Growth*, vol. 107, No. 1/4, Jan. 1, 1991, pp. 790–794; "In0.47Ga0.53As-InP heterostructures for Vertical Cavity Surface Emitting Lasers at 1.65 μm Wavelength" by R. D. Dupuis, et al.; p. 791, left column, line 6–right column, line 8.

Yoshifumi Tsunekawa et al., "High Power Operation of AlGaAs/GaAs Large Optical Cavity Lase Diode with $ZnS_xSe_{1-x}(x=0.06)$ Layer Grown by Adduct-Source Metalorganic Chemical Vapor Deposition Method", *Japanese Journal of Applied Physics*, vol. 28(11), pp. L2085-L2088, Nov., 1989.

K. Tai et al., "Drastic Reduction of Series Resistance in Doped Semiconductor Distributed Bragg Reflectors for Surface-Emitting Lasers", *Applied Physics Letters*, vol. 56(25), pp. 2496-2498, Jun. 18, 1990.

K. Mori et al., "Effect of Cavity Size on Lasting Characteristics of a Distributed Bragg Reflector-Surface Emitting Laser With Buried Heterostructure", *Applied Physics Letters*, vol. 60(1), pp. 21-22, Jan. 6, 1992.

*Primary Examiner*—Georgia Y. Epps
*Attorney, Agent, or Firm*—W. Douglas Carothers, Jr.

[57] ABSTRACT

A surface emitting semiconductor laser is provided with at least reflection mirrors on the substrate side composed of a first layer that is made of a Group III-V compound semiconductor and a second layer that is made of a Group III-V compound semiconductor with an energy bandgap that is larger than that of the first layer. The first and second layers are alternately stacked. The semiconductor laser is also composed of a distributive reflection multiple layer mirror that has an interface region between first and second layers having a carrier concentration that is higher than that of other regions. As a result, the multiple layer band structure of the distributive reflection mirror has been improved, current easily flows vertically through the multiple layers and the element resistance is low. In addition, a simple and reliable method is employed to fabricate the distributive reflection mirror because the doping concentration is controlled through dopant gas flow control or is controlled through light exposure.

33 Claims, 8 Drawing Sheets

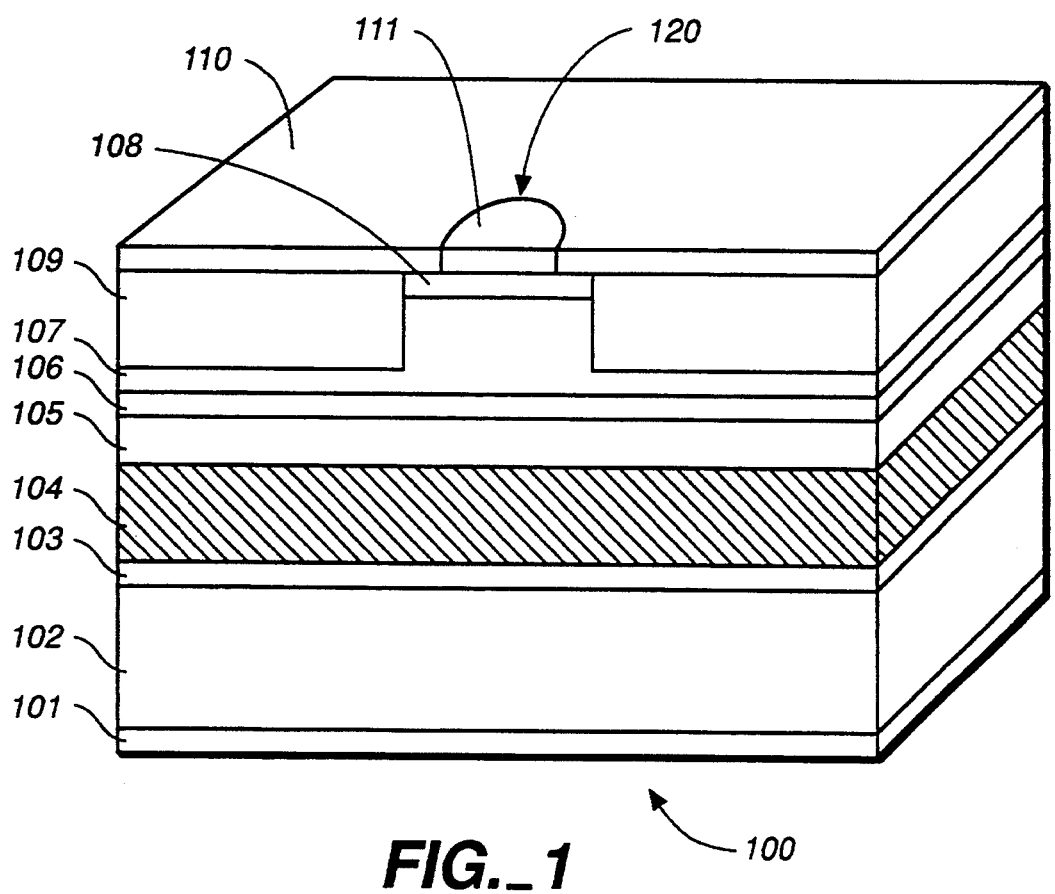
FIG._1
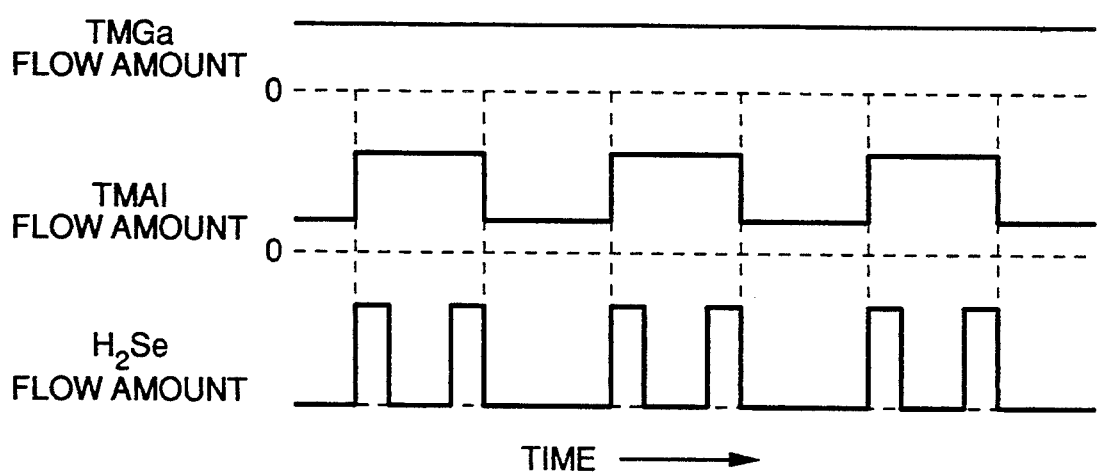
FIG._3

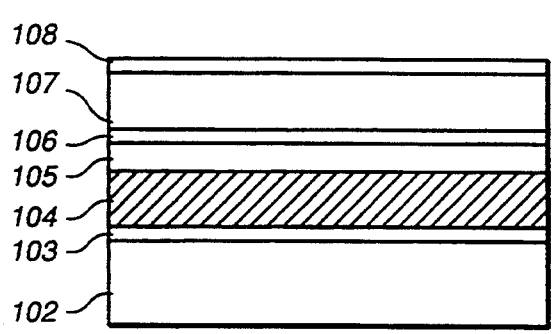
FIG._2A
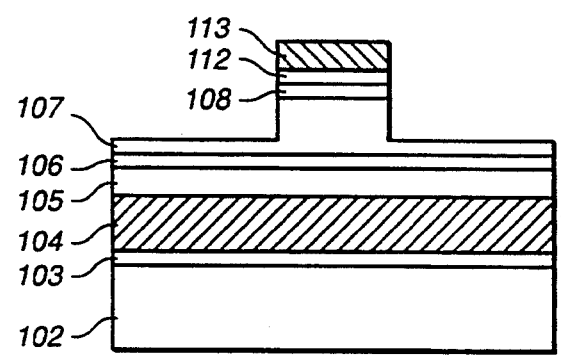
FIG._2B
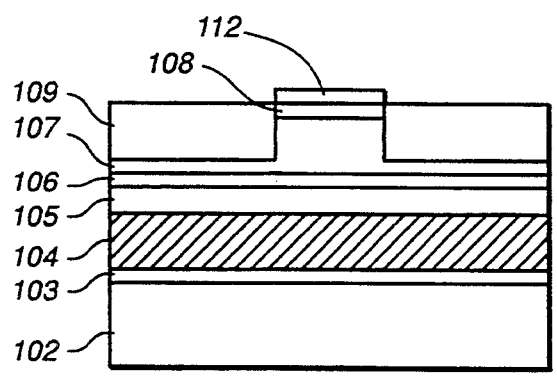
FIG._2C
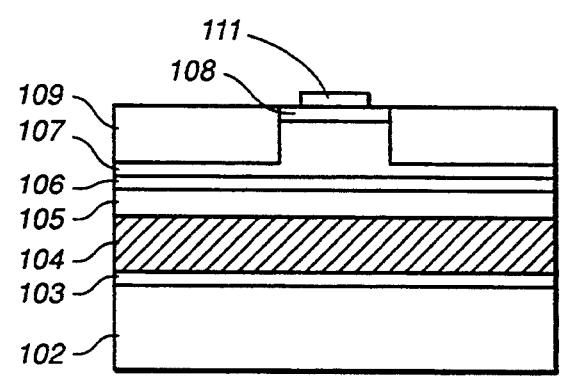
FIG._2D
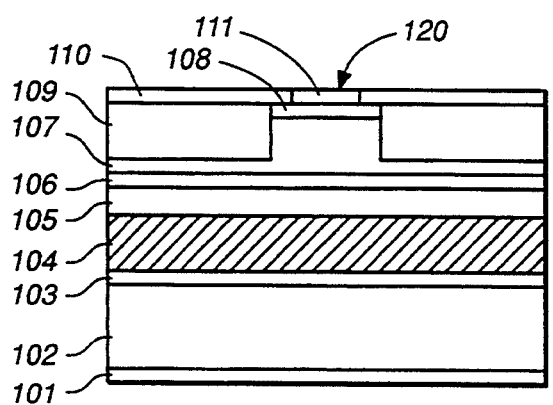
FIG._2E

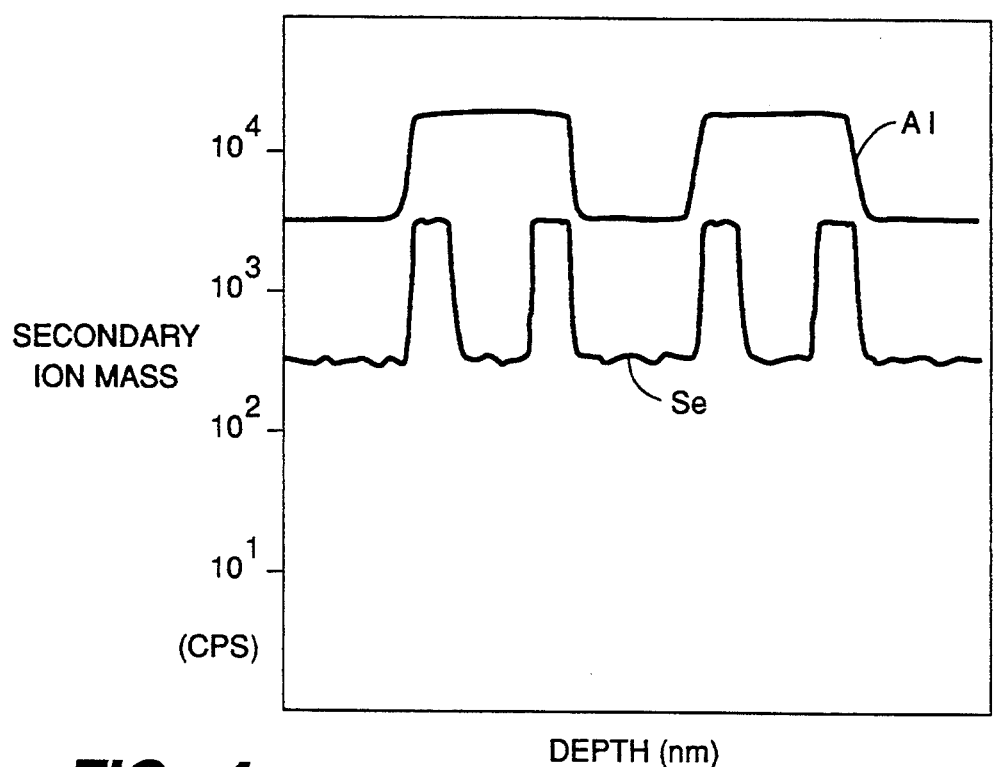
FIG._4
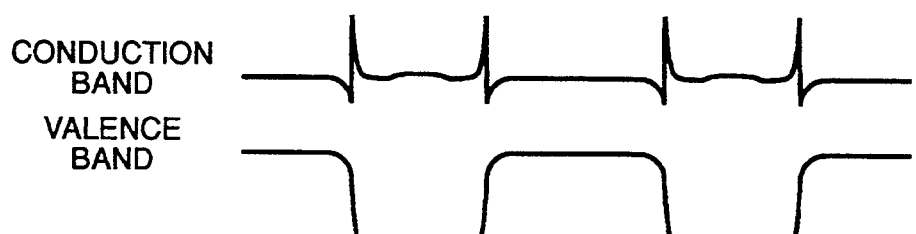
FIG._5A
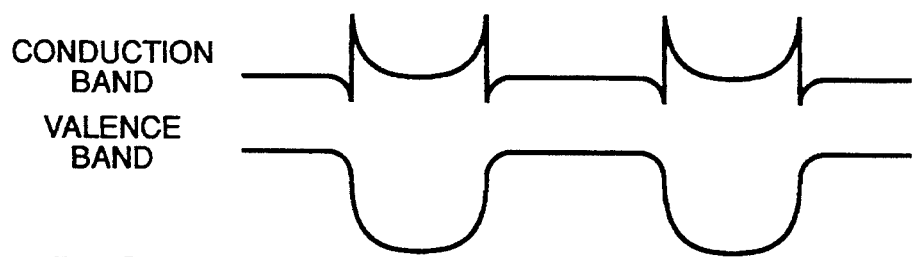
FIG._5B

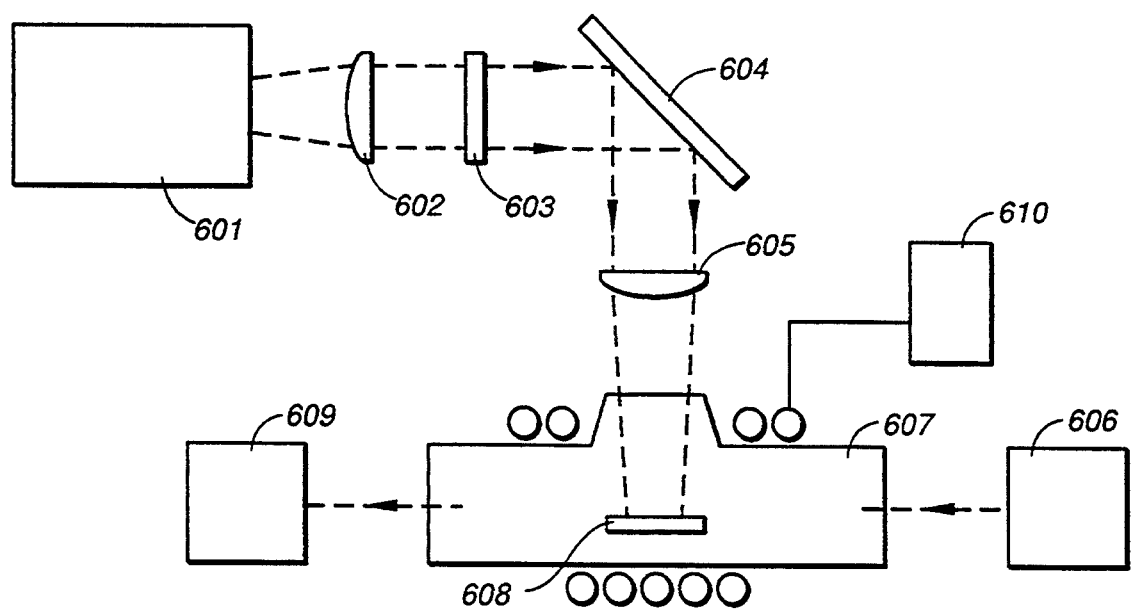
FIG._6
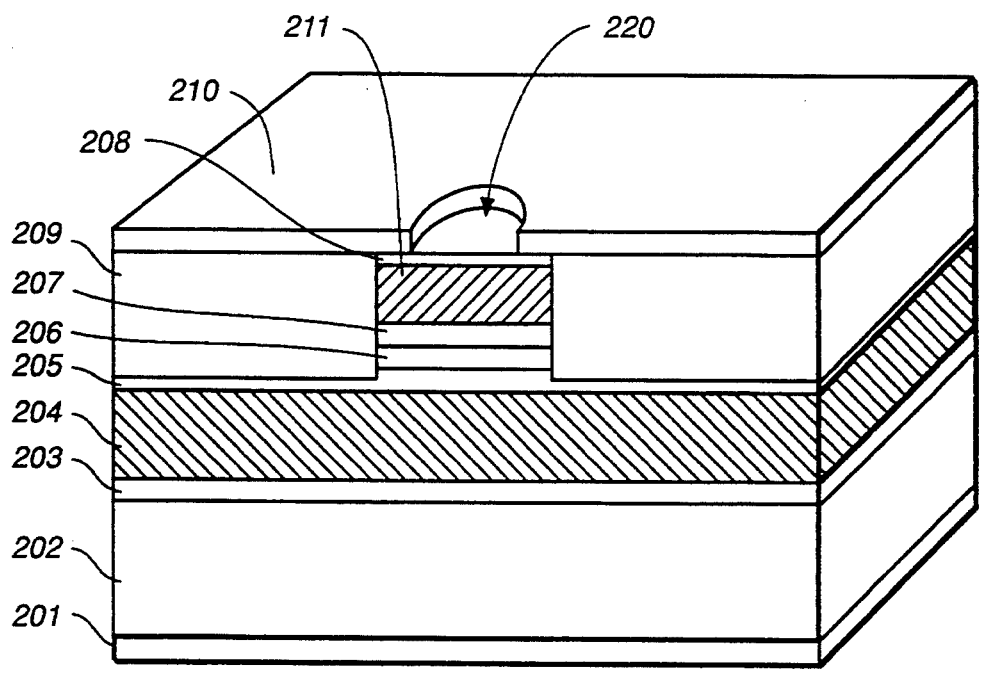
FIG._7

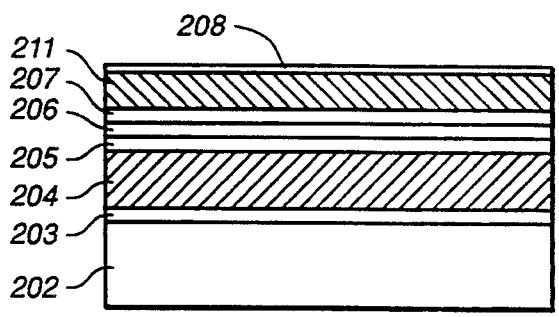
FIG._8A
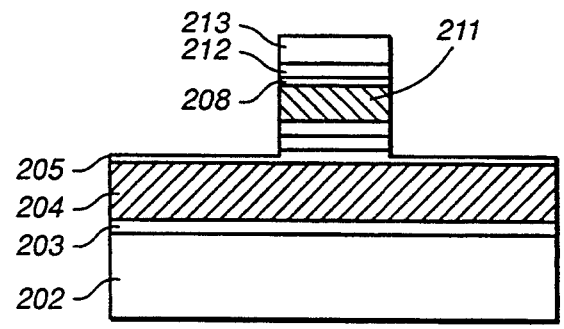
FIG._8B
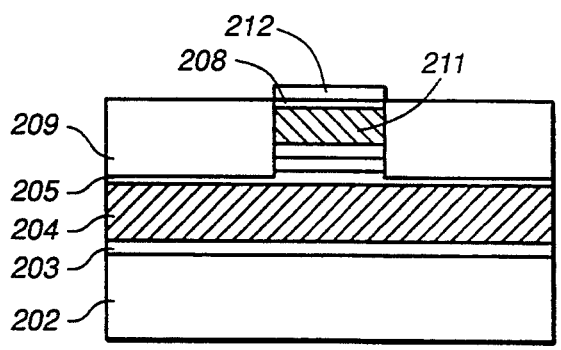
FIG._8C
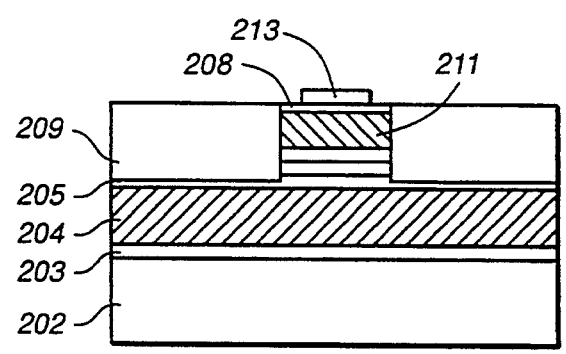
FIG._8D
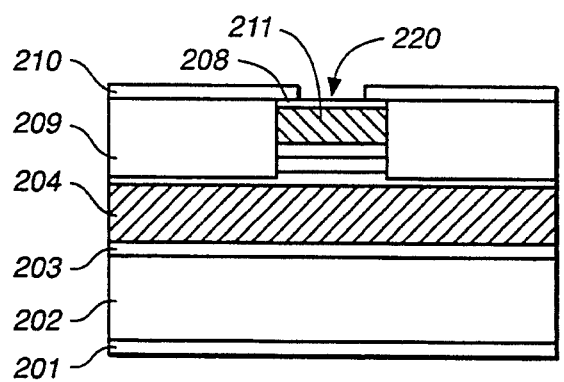
FIG._8E

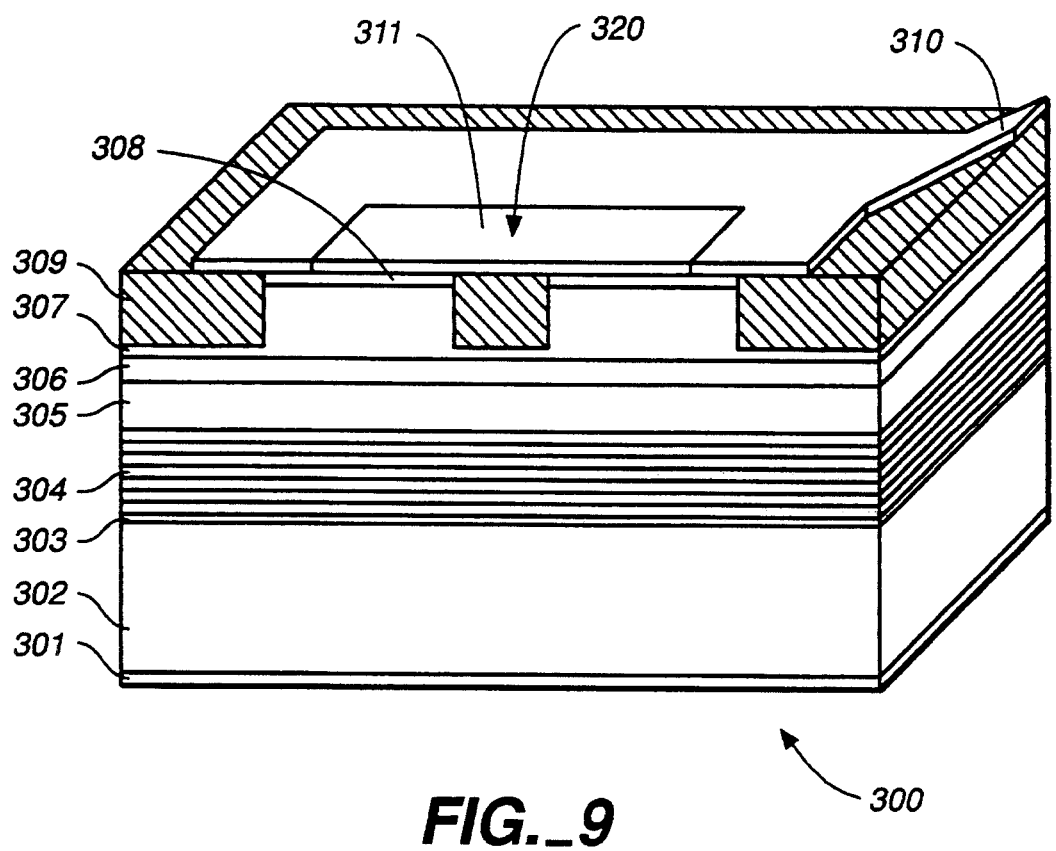
FIG._9
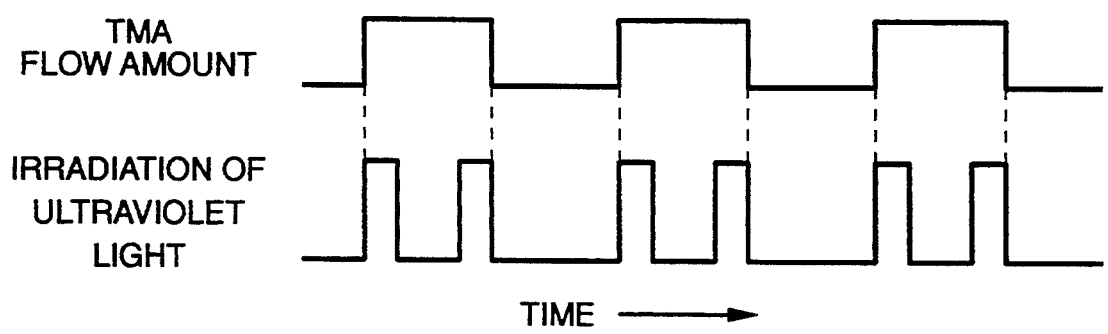
FIG._11

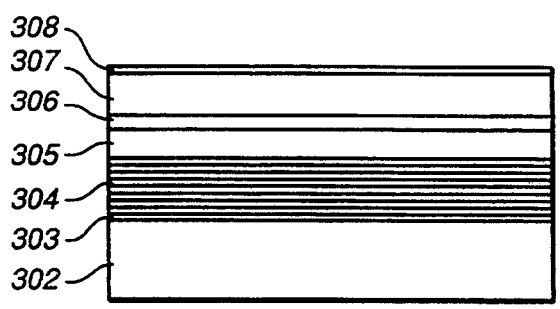
FIG._10A
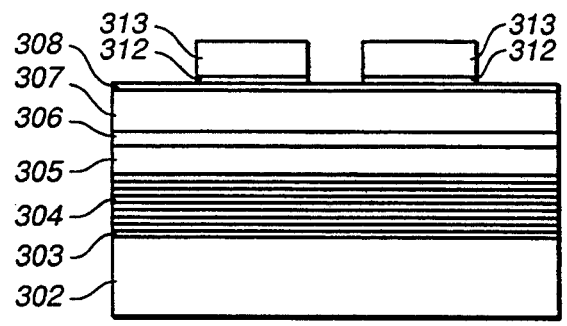
FIG._10B
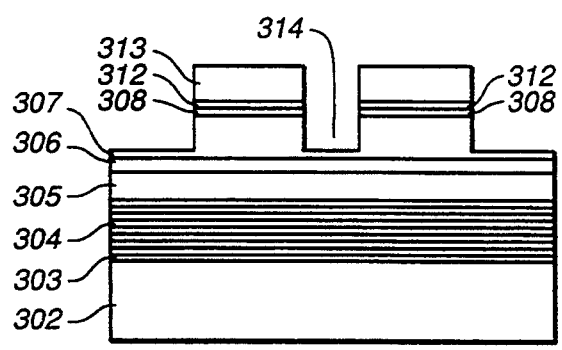
FIG._10C
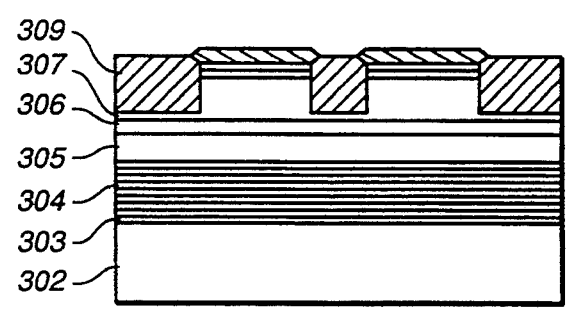
FIG._10D
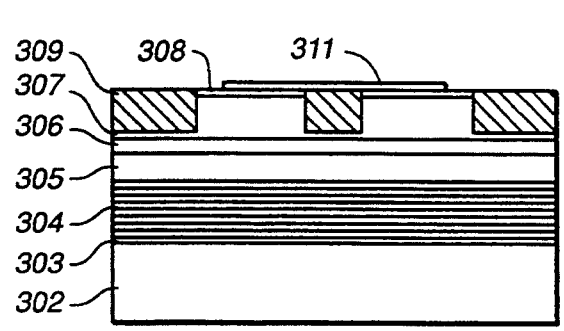
FIG._10E
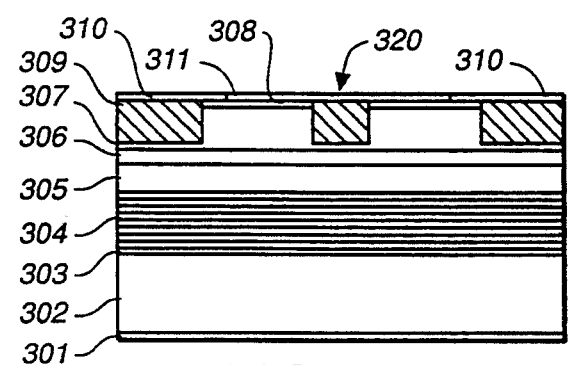
FIG._10F

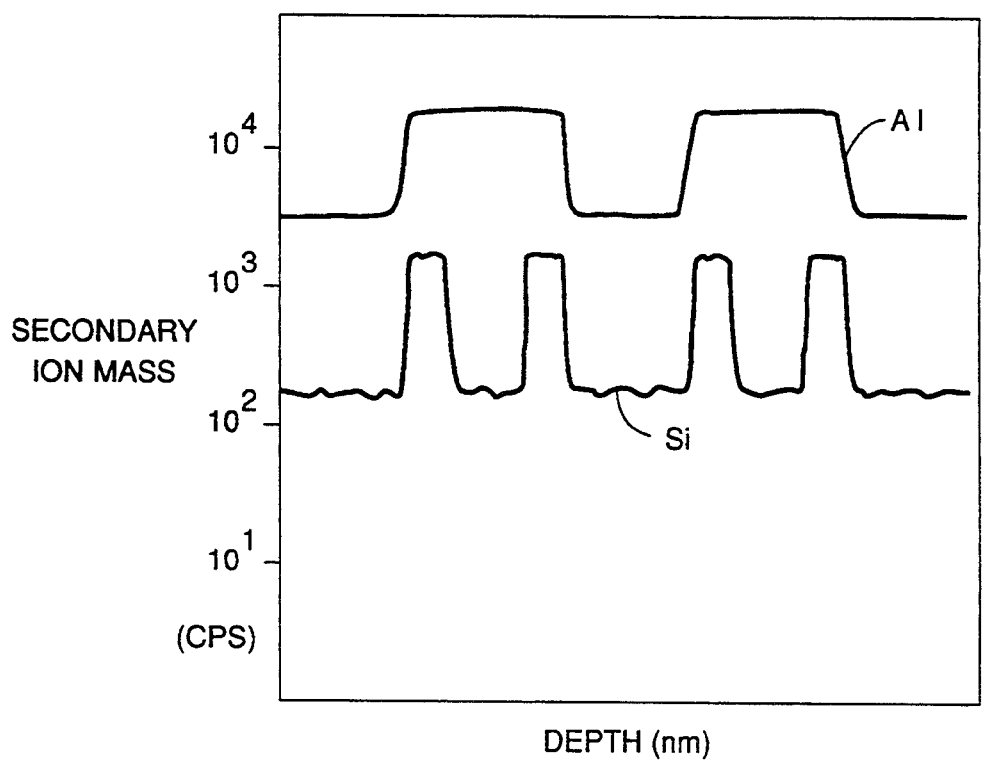
FIG._12
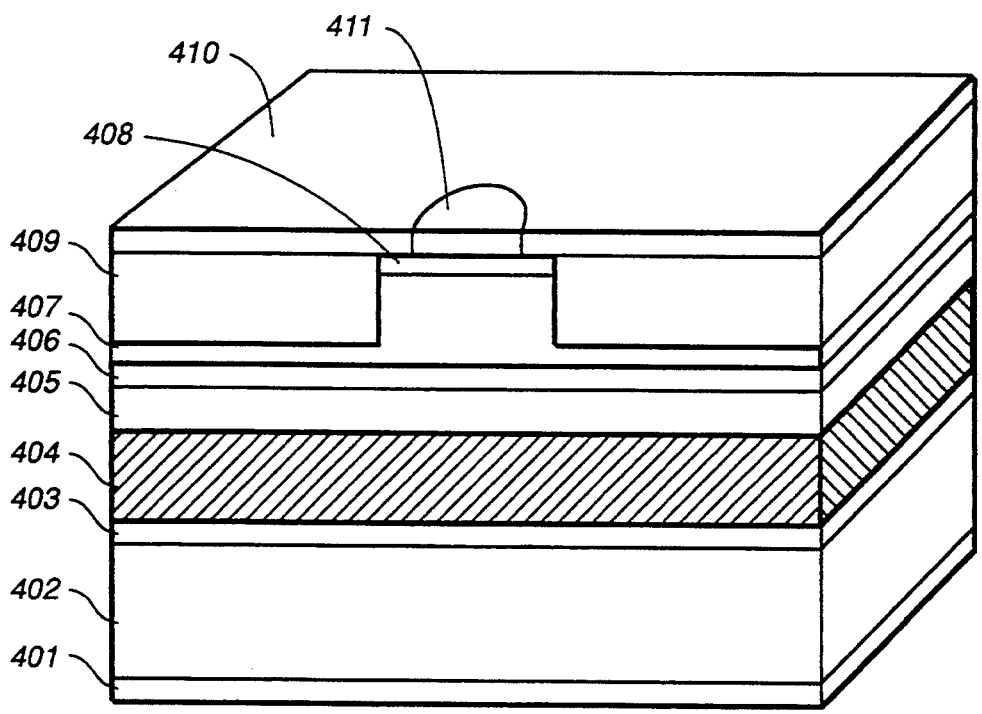
FIG._13
*(PRIOR ART)*

SURFACE EMITTING SEMICONDUCTOR LASER AND METHOD OF MANUFACTURE

This is a continuation of copending application Ser. No. 07/952,492 filed Jan. 19, 1993 now abandoned.

BACKGROUND OF THE INVENTION

1. Technical Field

This invention relates to surface emitting semiconductor lasers that emit laser light in a direction normal to the surface of the laser substrate and, further, relates to the manufacturing process of a surface emitting semiconductor laser.

2. Background Technology

We have previously proposed a surface emitting semiconductor laser with a buried optical resonator employing a Group II–VI compound semiconductor materials set forth in Japanese patent application No. 2-242000. This surface emitting semiconductor laser is illustrated in FIG. 13 and comprises an n-GaAs buffer layer 403, a distributed Bragg reflection type multiple layer mirror 404, an n-$Al_{0.4}Ga_{0.6}$As cladding layer 405, a p-GaAs active layer 406, a p-$Al_{0.4}Ga_{0.6}$As cladding layer 407, and a p-$Al_{0.4}Ga_{0.9}$As contact layer 408. These layers are sequentially grown on an n-GaAs substrate 402. The p-$Al_{0.4}Ga_{0.6}$As cladding layer 407 and the p-$Al_{0.1}G_{0.9}$As contact layer 408 are selectively etched leaving a columnar shaped region. Then, a $ZnS_{0.06}Se_{0.94}$ confinement layer 409 is formed in the removed regions of these two layers around the circumference of the column shaped region. Lastly, a p-type ohmic electrode 410 and a n-type ohmic electrode 401 are deposited on the top and bottom surfaces of the laser structure. After this, multi-layer mirror 411 is deposited in a region that is slightly smaller than the diameter of the column shaped region on the surface of p-$Al_{0.1}Ga_{0.9}$As contact layer 408.

Since $ZnS_{0.06}Se_{0.94}$ confinement layer 409, employed as a burying layer has a high resistance and low refractive index, the efficient confinement of current and light can take place, creating a high performance surface emitting semiconductor laser.

However, there are problems remaining with this technology. The flow of current in active layer 406 takes place through the distributed Bragg reflection mirrors. The distributed Bragg reflection mirrors have an AlGaAs layer with a large energy bandgap and a high aluminum content. Also, this layer may be comprised of alternately stacked layers of AlGaAs that have a large bandgap with a large aluminum content and a small bandgap with a low aluminum content. This results in a structural energy band that is not continuous and has high resistance rendering it difficult for the flow of current. As a result, the elemental resistance of the surface emitting semiconductor laser increases as the laser heats up through operation, resulting in inadequate reliability of the laser with an increase in the threshold current and making high speed modulation of the laser difficult.

To resolve these problems, we proposed a high concentration of dopant to the entire distributed Bragg reflection mirror in order to reduce the laser resistance. However, this resulted in the creation of a new problem. The film quality of the layer that comprises the distributed Bragg reflection mirror deteriorated and the laser characteristics were lost.

Tai, et al, in an article entitled "Drastic Reduction of Series Resistance in Doped Semiconductor Distributed Bragg Reflectors for Surface-Emitting Lasers", *Applied Physics Letter*, No. 56, pp. 2496–2498, Jun. 18, 1990 have attempted to resolve the same type of problem by fabricating an intermediate layer with an intermediate energy bandgap formed between the energy bandgaps of the two types of layers that form the distributed Bragg reflection mirrors. However, when we examined this approach, the following problems were encountered:

(1) Because three or more layers with different compositions have to be sequentially formed forming a stacked distributed Bragg reflection mirror, the manufacturing process becomes complicated, causing a reduction in yield and a lack of uniform properties.

(2) By fabricating a layer that has an intermediate bandgap, the hetero-barrier of the energy band is relieved. However, because the inclusion of this intermediate layer concurrently steepens the refractive index distribution among the distributed Bragg reflection mirrors with the same number of layers, there is a corresponding reduction in the reflection power of the mirror with the intermediate layer. This causes a deterioration in operating properties of the laser, for example, a rise in its threshold current.

A purpose of this invention is to resolve these foregoing problems.

It is an objective of this invention to offer a surface emitting semiconductor laser that is highly efficient and reliable.

It is a further object of this invention to provide a manufacturing process for fabricating a surface emitting laser utilizing simplified manufacturing steps.

SUMMARY OF THE INVENTION

According to this invention, a surface emitting semiconductor laser emits light in a vertical direction on a substrate and comprises an optical resonator that has a pair of reflecting mirrors and at least one semiconductor layer formed between these mirrors wherein at least one of the semiconductor layers is composed of at least one column or a plurality of columns with a Group II–VI compound semiconductor epitaxial layers formed around the column shaped semiconductor layer. This invention also comprises distributive reflection multiple layer mirrors wherein the substrate side reflection mirror contains a first layer comprising a Group III–V compound semiconductor and a second layer that has an energy bandgap that is larger than that of the first layer. In addition, the first layer and the second layer are alternately stacked, and the second layer is composed of Group III–V semiconductors with differing refractive indices. Further, the carrier concentration of the interface region between the first layer and second layer is higher than that in regions other than the interface region.

The surface emitting semiconductor laser of this invention emits light in a vertical direction utilizing an optical resonator comprising a pair of reflecting mirrors and at least one semiconductor layer formed between these mirrors, and wherein at least one of the semiconductor layers comprises at least one column or a plurality of columns. This invention also comprises a Group II–VI compound semiconductor epitaxial layer that is formed around the columnar shaped semiconductor layer and distributive reflection multiple layer mirrors wherein among the employed reflection mirrors, the substrate side reflection mirror has a first layer that comprises a Group III-V compound semiconductor and a second layer that has an energy bandgap that is larger than that of the first layer. In this invention, the first layer and the second layer are alternately stacked with the second layer comprising Group III-V semiconductors having differing refractive indices.

The surface reflection mirrors may comprise a third layer of a Group III-V compound semiconductor and a fourth layer of a Group III-V compound semiconductor having an energy bandgap larger than that of the third layer. The third layer and fourth layers are alternately stacked and the fourth layer is composed of Group III-V semiconductors with differing refractive indices. The carrier concentration of the interface region between the third layer and fourth layer is higher than in other regions. In addition, the carrier concentration of the interface region between the third layer fourth layer also is higher than that of other regions.

In the surface emitting semiconductor laser of this invention, the first layer and third layer employ the same Group III-V compound semiconductor and the second layer and fourth layer employ the same Group III-V compound semiconductor. The maximum value of the carrier concentration of the interface region of the surface emitting semiconductor laser of this invention will be a minimum of 1.1 times and within 100 times the value of the regions of the laser, other than the interface region. The maximum value of the carrier concentration of the interface region has a value that is $5 \times 10^{20}$ cm$^{-3}$ or less. The thickness of the interface region is within $\frac{1}{3}$ of the sum of the thicknesses of the first layer and second layer, or the thickness of the interface region is within $\frac{1}{3}$ of the sum of the thicknesses of the third layer and fourth layer. The dopants employed for the n-type doping of the interface region are S, Se, Te and Si and the dopants employed for the p-type doping of the aforesaid interface region are Zn, C, Be, Mg and Ca.

This invention relates to a manufacturing process for a surface emitting semiconductor laser of the type wherein light is projected in a vertical direction on a substrate and comprises the use of a metal-organic chemical vapor deposition method or a molecular beam epitaxial growth method for forming the pair of reflection mirrors as well as at least one semiconductor layer that is formed between these mirrors for fabricating an optical resonator on a semiconductor substrate comprising a semiconductor or dielectric material. The process also includes the formation of a photoresist mask on the semiconductor layers and selectively etching at least one of the layers to form either one column or a plurality of columns followed by the formation of a Group II-VI compound semiconductor region around the formed columnar shaped semiconductor layer to form a buried region.

In the manufacturing process of this invention, among the formed reflection mirrors, the substrate side reflection mirror comprises a first layer of a Group III-V compound semiconductor and a second layer that has an energy bandgap that is larger than that of the first layer. The first layer and second layer are alternately stacked, and the second layer comprises a Group III-V semiconductor with differing refractive indices. When growing at least one of the interface region of the first layer and second layer, the carrier concentration of the interface region is increased so that it is higher than that of the other interface regions by increasing the amount of doping of the interface region.

The manufacturing process for the surface emitting semiconductor laser of this invention comprises the use of a metal-organic chemical vapor deposition method or a molecular beam epitaxial growth method for forming a pair of reflection mirrors and employs at least one semiconductor layer formed therebetween for forming an optical resonator on a substrate comprising a semiconductor or dielectric material. This process further includes the formation of a photoresist mask on these semiconductor layers and the selective etching of at least one of the semiconductor layers to form either one column or a plurality of columns followed by the formation of a Group II-VI compound semiconductor region around the formed columnar shaped semiconductor layer to form a buried region. Among the formed reflection mirrors, the substrate side reflection mirror comprises a first layer of a Group III-V compound semiconductor and a second layer that has an energy bandgap that is larger than that of the first layer. The first layer and the second layer are alternately stacked, and the second layer comprises a Group III-V semiconductors with differing refractive indices. The surface side reflection mirror has a third layer comprising Group III-V compound semiconductor and a fourth layer comprising a Group III-V compound semiconductor in which the bandgap is larger than that of the third layer. The third and fourth layers are alternately stacked, and the fourth layer is formed of Group III-V semiconductor materials having differing refractive indices.

When growing at least one of the interface regions of the first and second layers and when growing at least one of the interface regions of the third and fourth layers, the carrier concentration of the interface region is increased so that it is higher than that of other regions by increasing the amount of the dopant on the interface surfaces of the third and fourth layers. The amount of the material employed for doping in the interface region and the amount of the material employed for doping in regions other than the interface region are instantaneously changed. The amount of material for doping the interface region and the amount of the material used for doping in regions other than the interface region are linearly changed or changed as a quadratic function or changed as a cubic function within $\frac{1}{2}$ the time required for doping the interface region.

The manufacturing process for the surface emitting semiconductor laser of this invention comprises the use of a metal-organic chemical vapor deposition method or a molecular beam epitaxial growth method for forming a pair of reflection mirrors and employs at least one semiconductor layer formed therebetween for forming an optical resonator on a substrate comprising a semiconductor or dielectric material. This process further includes the formation of a photoresist mask on these semiconductor layers and the selective etching of at least one of the semiconductor layers to form either one column or a plurality of columns followed by the formation of a Group II-VI compound semiconductor region around the formed columnar shaped semiconductor layer to form a buried region. Among the formed reflection mirrors, the substrate side reflection mirror comprises a first layer of a Group III-V compound semiconductor and a second layer that has an energy bandgap that is larger than that of the first layer. The first layer and the second layer are alternately stacked, and the second layer comprises a Group III-V semiconductors with differing refractive indices. When growing the interface region of at least one layer formed between the first and second layer, the carrier concentration of the interface region is increased through the exposure to light so that its carrier concentration is higher than regions other than the interface region.

The manufacturing process for the surface emitting semiconductor laser of this invention comprises the use of a metal-organic chemical vapor deposition method or a molecular beam epitaxial growth method for forming a pair of reflection mirrors and employs at least one semiconductor layer formed therebetween for forming an optical resonator on a substrate comprising a semiconductor or dielectric material. This process further includes the formation of a photoresist mask on these semiconductor layers and the selective etching of at least one of the semiconductor layers to form either one column or a plurality of columns followed by the formation of a Group II–VI compound semiconductor region around the formed columnar shaped semiconductor layer to form a buried region. Among the formed reflection mirrors, the substrate side reflection mirror comprises a first layer of a Group III–V compound semiconductor and a second layer that has an energy bandgap that is larger than that of the first layer. The first layer and the second layer are alternately stacked, and the second layer comprises a Group III–V semiconductors with differing refractive indices. In addition, the surface side reflection mirror is made through the alternate stacking of the third layer, which is made of a Group III–V compound semiconductor, and the fourth layer, which has an energy bandgap that is larger than that of the third layer and also is made of Group III–V compound semiconductors with differing refractive indices. Further, when the interface region of at least one of the semiconductor layers is grown, i.e., either the first layer or the second layer, the carrier concentration of the interface region is increased to be higher than that of regions other than the interface region by means of the exposure to light. A preferred dopant material for forming the carrier concentration is tetra methyl silane, which is employed when growing the reflection mirrors.

When increasing the carrier concentration of the interface region, it is desirable to concurrently change the supplied volume of the Group III material and the Group V material. This will allow for the formation of a hetero-interface between the first layer and the second layer forming the multiple layers of the distributive reflection multiple layer mirrors. It will also allow the formation of high carrier concentration areas on the hetero-interface between the third layer and the fourth layer. This will improve the non-continuous band structure by increasing the tunnel conductance of the electrons and holes allowing for the formation of a distributive reflection multiple layer mirror with extremely low resistance with no major change in the refractive index distribution. As a result, there will be no reduction in the reflection power of the mirror. Also, the overall laser resistance will drop providing a surface emitting semiconductor laser with low heat, high-speed operation and high reliability.

In addition, employing the manufacturing process of this invention, the dopant material may be temporarily increased, light may be temporarily placed on the growth surface, the Group V material and the Group III material may be temporarily changed and the carrier concentration may be increased in selected areas of the interface region or regions. The carrying out the operational steps of the methods are extremely simple and the manufacturing process takes place in a stable manner with good repeatability.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a cross sectional perspective view illustrating a first embodiment of a surface emitting semiconductor laser comprising this invention.

FIGS. 2A–2E show various cross sectional views of the first semiconductor laser embodiment of FIG. 1 illustrating the manufacturing process for the laser.

FIG. 3 is a timing chart illustrating the changes in the flow rates for TMGa, TMAl and $H_2Se$ in growing the distributed Bragg reflection multiple layer mirror of the semiconductor laser of FIG. 1.

FIG. 4 is a graphic illustration of the results obtained by the use of SIMS for the purposes of evaluating a portion of the distributed reflection multiple layer mirror of the semiconductor laser embodiment of FIG. 1.

FIGS. 5A and 5B is a graphic illustration of the conductive and valence bands of the distributed Bragg reflection multiple layer mirror relative to the semiconductor laser embodiment of FIG. 1. FIG. 5A illustrates the bands when the concentration of Se is sharply increased in the interface region of a n-type $Al_{0.1}Ga_{0.9}As$ layer within a n-type $Al_{0.7}Ga_{0.3}As$ layer. FIG. 5B illustrates the bands when generated by supplying a constant amount of Se without regard to composition.

FIG. 6 is a schematic presentation of the MOCVD apparatus employed for fabricating the semiconductor laser of this invention.

FIG. 7 is a cross sectional perspective view illustrating a second embodiment of a surface emitting semiconductor laser comprising this invention.

FIGS. 8A–8E show various cross sectional views of the second semiconductor laser embodiment of FIG. 7 illustrating the manufacturing process for the laser.

FIG. 9 is a cross sectional perspective view illustrating a third embodiment of a surface emitting semiconductor laser comprising this invention.

FIGS. 10A–10F show various cross sectional views of the third semiconductor laser embodiment of FIG. 9 illustrating the manufacturing process for the laser.

FIG. 11 is a timing chart illustrating the changes in flow rate of TMAl and the exposure of light when growing the distributed Bragg reflection multiple layer mirror of the semiconductor laser of FIG. 9.

FIG. 12 is a graphic illustration of the results obtained by the use of SIMS for the purposes of evaluating a portion of the distributed reflection multiple layer mirror of the semiconductor laser embodiment of FIG. 9.

FIG. 13 is a cross sectional perspective view illustrating a previously known embodiment of a surface emitting semiconductor laser.

DESCRIPTION OF THE PREFERRED EMBODIMENTS

Reference is now made to a detail description of three representative embodiments comprising this invention.

First Embodiment

FIG. 1 illustrates a cross sectional view of semiconductor laser 100 comprising the first embodiment of this invention. FIGS. 2A-2E illustrate in cross section the steps in the manufacturing process of the semiconductor laser 100. In this connection, FIGS. 2A-2E are employed to describe the construction of and manufacturing process for semiconductor laser 100.

(1) First, a n-GaAs buffer layer 103 is formed on a n-GaAs substrate 102. Next, 30 pairs of distributed Bragg reflection multiple mirror layers 104, comprising alternating layers of n-$Al_{0.7}Ga_{0.3}As$ layer and n-$A_{0.1}Ga_{0.9}As$, are formed and have a reflection power of 98% or higher relative to light generated in the 870 nm wavelength region. Next, sequentially formed are a n-$Al_{0.4}Ga_{0.6}As$ cladding layer 105, a p-GaAs active layer 106, a n-type $Al_{0.4}Ga_{0.6}As$ cladding layer 107 and a p-$Al_{0.1}Ga_{0.9}As$ contact layer 108 by means of epitaxial growth employing MOCVD (FIG. 2A). In this embodiment, the epitaxial growth temperature is 700° C., the epitaxial growth pressure is 150 Torr, and the Group III materials employed are organic metals TMGa (tri methyl gallium) and TMAl (tri methyl aluminum). The Group V materials comprise $AsH_3$, the n-type dopant is $H_2Se$ and the p-type dopant is DEZn (diethyl zinc).

Reference is now made to the manufacturing process steps for distributed Bragg reflection multiple layer mirror 104. FIG. 3 illustrates the changes in flow rates of TMGa and TMAl, which are the materials employed when growing the distributed reflection multiple layer mirrors, and the n-type dopant. Because the flow of TMGa is supplied at a constant rate, the area with the higher TMAl flow rate forms the n-$Al_{0.7}Ga_{0.3}As$ layer and the lower TMAl flow rate forms the n-$Al_{0.1}Ga_{0.9}As$ layer. Here, the thickness of each layer is controlled so that $\frac{1}{4}$ of the wavelength of the 870 nm wavelength light propagates through the layer. In addition, at the same time, the high flow rate $H_2Se$ section shows the growth portion in which the high concentration doping of the n-type carrier is desired, and the low flow rate $H_2Se$ section shows the growth portion in which the low concentration doping of the n-type carrier is desired. Relative to the necessary changes to gas flow rates in the MOCVD apparatus, the control of the amount of doping takes place at the desired interface by changing the high flow rate lines and low flow rate lines of the $H_2Se$ flow through the employment of a computer controlled valve. In addition, in this embodiment, the highly $H_2Se$-doped section, i.e., in the interface region between the n-$Al_{0.1}Ga_{0.9}As$ layer and the n-$Al_{0.7}Ga_{0.3}As$ layer, is such that the impurity concentration rises steeply relative to the TMAl high growth section.

(2) After the growing of the epitaxial layers 103-108, $SiO_2$ layer 112 is formed on the laser surface by means of thermal CVD. The columnar shaped portion is formed by covering a portion of layer 112 with photoresist 113 and partial, selective etching of the p-$Al_{0.4}Ga_{0.3}As$ cladding layer 107 takes place leaving the columnar shaped portion shown in FIG. 2B. The etching gas employed may be comprised of a mixture of chlorine and argon gases. The gas pressure may be $1 \times 10^{-3}$ Torr and the extraction voltage may be 400 volts. The purpose for p-$Al_{0.4}Ga_{0.6}As$ cladding layer 107 being partially etched is to provide a rib waveguide structure for carrier and light confinement in active layer 106.

(3) Next, a burying layer is formed on the remaining portion of the p-$Al_{0.4}Ga_{0.6}As$ cladding layer 107. For this purpose, in this embodiment, photoresist layer 113 is first removed and then a $ZnS_{0.06}Se_{0.94}$ layer 109 is formed employing either MBE or MOCVD.

(4) After this, $SiO_2$ layer 112 is removed and four pairs of $SiO_2$/a-Si dielectric multiple layer mirrors are formed employing electron beam deposition. Dry etching, employing reactive ion etching method (RIE), is employed to remove a region slightly smaller than the diameter of the emitting section (FIG. 2D). The reflection power of the dielectric multiple layer mirrors is 94% at a wavelength of 870 nm.

(5) Next, a p-type ohmic electrode 110 is deposited on surfaces other than the dielectric multiple layer mirrors 112 and a n-type ohmic electrode 101 is deposited on GaAs substrate 102 (FIG. 2E). Finally, alloying of these electrodes takes place in an $N_2$ atmosphere at 400° C.

Surface emitting semiconductor laser 100 of this embodiment employs a $ZnS_{0.06}Se_{0.94}$ layer as a burying layer. This layer has a resistance value of one giga ohm or higher. An extremely effective current constriction can be achieved because there is no leakage of applied current to burying layer 109. In addition, because burying layer 109 is not required to have a multiple layer structure, it can be grown easily and provides for a high level of repeatability in production.

Because surface emitting semiconductor laser 100 has a rib waveguide structure, there is an increase in the refractive index of active layer 106 at the bottom of the $ZnS_{0.06}Se_{0.94}$ layer and that of active layer 106 within the resonator sector thereby simultaneously providing an effective light waveguide.

Here, the results of the evaluation of a portion of the distributed Bragg reflection multiple layer mirrors 111 employing the SIMS are shown in FIG. 4. In FIG. 4, the vertical coordinate indicates the number of secondary ions of Al and Se. They correspond to the volume of atoms and number of carriers contained in the layer. The horizontal coordinate indicates the depth of the film thickness in a portion of the distributed Bragg reflection multiple layer mirrors 111. Upon comparison of FIG. 4 with FIG. 3, the concentration of Se, which is an n-type dopant, will increase sharply at the interface region of the n-$Al_{0.1}Ga_{0.9}As$ layer within the n-$Al_{0.7}Ga_{0.3}As$ layer, confirming that the desired amount of doping at this point has taken place.

The effectiveness of this invention is illustrated in the typical energy bands in FIG. 5 for distributed Bragg reflection multiple layer mirror 111. FIG. 5A illustrates the case in which the concentration of the Se that was generated by means of this embodiment sharply increasing the carrier concentration at the interface region between the n-$Al_{0.1}Ga_{0.9}As$ layer and the n-$Al_{0.7}Ga_{0.3}As$ layer. FIG. 5B illustrates the case in which Se was generated and supplied in a constant volume in a low concentration, regardless of composition. When both illustrations are compared, the walls of the conduction band become thin and the electrons are easily prone to tunnel through the conduction band as a result of the increased carrier concentration in the interface region. Thus, it is understood that the resistance in the vertical direction will decrease in the multiple film layers.

In addition, because the only place where the carrier concentration has been increased by means of doping is the interface region of the layers, there is no deterioration in film quality due to the high concentration of dopant.

FIG. 6 shows a block diagram of the major components of the MOCVD apparatus employed in connection with this embodiment of the invention. In this apparatus, the material is put into reaction tube 607 from material introduction system 606 and this gas is permitted to flow onto substrate 608 which is heated by means of RF oscillator 610 growing a compound semiconductor thin film. The used material is discharged through gas exhaust system 609. In addition, the material can be introduce instantaneously to reaction tube 607 by means of a valve that is computer controlled. Moreover, the supplied volume can be controlled to a predetermined volume through a mass flow controller (MFC). Although not employed in this embodiment, this apparatus is also equipped with an excimer laser 601. The ultraviolet light from excimer laser 601 is collimated by means of cylindrical lenses 602 and 603, reflected by a mirror 604 and then passed through condenser lens 606 for projection onto the substrate during the growing process.

Second Embodiment

FIG. 7 is a cross sectional perspective view of the emitting section of semiconductor laser 200 comprising second embodiment of this invention. FIGS. 8A-8E various cross sectional views of the steps in the manufacturing process of semiconductor laser 200.

Semiconductor laser 200 of the second embodiment differs from that of the laser of the first embodiment, described above, in that the emitting section is, in part, formed in the shape of a column from the p-$Al_{0.1}Ga_{0.9}As$ contact layer 208 to the p-$Al_{0.4}Ga_{0.6}As$ cladding layer 205 and, further, a distributed Bragg reflection multiple layer mirror 211 is formed on p-type ohmic electrode 210. The construction and manufacturing process of this embodiment will be described below relative to FIGS. 8A-8E.

(1) First, an n-type GaAs buffer layer 203 is formed on an n-GaAs substrate 202. Next, 30 pairs of distributed Bragg reflection multiple layer mirrors 204 are formed. These mirrors have a light reflection power of 98% or more relative to a wavelength in a vicinity of 870 nm, which is provided from alternating layers of n-AlAs and an n-$Al_{0.1}Ga_{0.9}As$. Next, an n-$Al_{0.4}Ga_{0.6}As$ cladding layer 205, a p-type GaAs active layer 206 and a p-$Al_{0.4}Ga_{0.6}As$ cladding layer 207 are epitaxially formed in sequence. Next, 25 pairs of distributed Bragg reflection multiple layer mirrors 211 are formed. These mirrors have a light reflection power of 94% or more relative to a wavelength in a vicinity of 870 nm, which is provided from alternating layers of n-AlAs and an n-$Al_{0.1}Ga_{0.9}As$. Next, a p-$Al_{0.1}Ga_{0.9}As$ contact layer 208 is grown by means of epitaxial growth employing MOCVD (FIG. 8A). Relative to this embodiment, the growth temperature is 700° C., the growth pressure is 150 Torr, the Group III materials are the organic metals TMGa (tri methyl gallium) and TMAl (tri methyl aluminum), the Group V material is $AsH_3$, the n-type dopant is $H_2Se$, and the p-type dopant is DEZn (diethyl zinc).

In the fabrication of the distributed Bragg reflection multiple layer mirrors 204 and 211, the dopant concentration at the into;trace of the layers is increased by controlling the supply of $H_2Se$ in the case of the distributed Bragg reflection multiple layer mirror 204 during the fabrication of this layer and by controlling the supply of DEZn in the case of the distributed Bragg reflection multiple layer mirror 211, as in the case of the previously described first embodiment.

(2) Next, RIBE is employed to provide a columnar shaped emitting section that is covered with photoresist 213 and selective etching is carried out partially into n-$Al_{0.4}Ga_{0.6}As$ cladding layer 205 (FIG. 8B). In this embodiment, a mixed gas of chlorine and argon is employed as the etching gas. The gas pressure is $1\times10^{-3}$ Torr and the extraction voltage is 400 volts.

(3) Next, a burying layer will be formed in the etched out region. For this purpose, photoresist 213 is removed and either MBE or MOCVD is employed to bury and grow a $ZnS_{0.6}Se_{0.94}$ layer 209 (FIG. 8D).

(4) Then, $SiO_2$ layer 212 is then removed. Next, a region that is a little smaller than the diameter of the emitting section will be formed by employing a photoresist on the surface of contact layer 208.

(5) Next, a p-type ohmic electrode 210 is deposited on the surface and the lift-off method is employed to form a light exit aperture in the surface of the emitting section. An n-type ohmic electrode 201 is deposited on the GaAs substrate 202 (FIG. 8E). Finally, electrode alloying is accomplished in a nitrogen atmosphere at 400° C.

As shown in FIG. 7, it is possible to achieve a surface emitting semiconductor laser 200 with a burying structure by means of the process steps set forth above.

The $ZnS_{0.06}Se0.94$ layer has a resistance of 1 giga ohm or higher. A very effective current constriction can be achieved because there is no current leakage through burying layer 209. In addition, because burying layer 209 is not required to be of a multiple layer structure, it can be easily grown easily with a high level of repeatability. Furthermore, a $ZnS_{0.06}Se_{0.94}$ layer, which has a substantially smaller refractive index compared to GaAs, provides a more effective light confinement due to the formed buried type, refractive index waveguide structure produced in which active layer 206 is buried.

Moreover, as a result of the increase in the carrier concentration of the interface region of the layers that compose the distributed Bragg reflection multiple layer mirrors 204 and 211, the walls of the conduction band are thinner and the tunnel conduction of the electrons is made easy. Further, the valence band is smoother and the holes conduct more easily thereby making it possible to appreciate that the electrical resistance will decrease in the vertical direction of the multiple film layers. Because the interface regions between the mirror layers are the only areas in which the carrier concentration has been increased through increased doping, there is no film quality deterioration due to high concentrations of dopants at these points.

In this embodiment, when the relationship between the amount of doping and the resistance of the distributed Bragg reflection multiple layer mirrors was examined, the ratio between the maximum value of the carrier concentration of the interface region and the minimum value of the carrier concentration in regions other than the interface region, the effects of the low resistance began to appear at 1.1 times and continued to about 100 times. However, when increased to over 100 times, the increase in the low resistance effect seen was not much of an enlargement of this ratio. With the view toward making the control of the supply volume easier, the optimum value should have a ratio of from 2 times to 20 times. Also, it was confirmed that the maximum value of the interface region carrier concentration should be at $5\times10^{20}$ cm$^{-3}$ or lower. This was due to the fact that it was confirmed that the film quality would deteriorate if the concentration of Zn was increased higher than this level and that the reflection power of the distributed Bragg reflection multiple layer mirrors would also deteriorate.

Third Embodiment

FIG. 9 illustrates a cross sectional perspective view of the emitting section of semiconductor laser 300 comprising a third embodiment of this invention. FIGS. 10A–10F various cross sectional views of the steps in the manufacturing process of semiconductor laser 300.

Semiconductor laser 300 differs from that of the first and second embodiments, previously described above, in that p-$Al_{0.5}Ga_{0.5}As$ cladding layer 307 is divided into a plurality of columns that are separated by separation grooves to form the emitting section. The construction and the manufacturing process of this embodiment will be described in connection with FIGS. 10A–10F.

(1) First, an n-type GaAs buffer layer 303 is formed on an n-type GaAs substrate 302. Next, 25 pairs of semiconductor multiple layer mirrors 304 are formed. These mirrors have a reflection power of 98% or more relative to light with a wavelength in the vicinity of 780 nm, which is provided from alternating layers of n-$Al_{0.9}Ga_{0.1}As$ and n-$Al_{0.2}Ga_{0.8}As$. Next, an n-$Al_{0.5}Ga_{0.5}As$ cladding layer 305, a p-$Al_{0.13}Ga_{0.87}As$ active layer 306, a p-$Al_{0.5}Ga_{0.5}As$ cladding layer 307 and a p-$Al_{0.15}Ga_{0.85}As$ contact layer 308 are epitaxially formed in sequence employing MOCVD (FIG. 10A). In this embodiment, the conditions for epitaxial growth are an epitaxial growth temperature of 720° C. and a pressure of 150 Torr. In addition, the Group III materials are the organic metals TMGa (tri methyl gallium) and TMAl (tri methyl aluminum). The Group V material is $AsH_3$, the n-type dopant is TMSi (tetra methyl silane) and the p-type dopant is DEZn (dimethyl zinc).

Reference is now made to the manufacturing process steps for distributed Bragg reflection multiple layer mirror 304 employing also an exposure light, e.g., ultraviolet light. FIG. 11 illustrates the changes in the amount of flow of TMAl and the exposure to light relative to time. TMAl is a base material employed for distributed Bragg reflection multiple layer mirror 304. The area with the higher TMAl flow rate forms the n-$Al_{0.9}Ga_{0.1}As$ layer. The area with the lower TMAl flow rate forms the n-$Al_{0.2}Ga_{0.8}As$ layer. Here, the thickness of each layer is controlled so that it is ¼ of the wavelength of the 780 nm wavelength light that propagates through the layer. In addition, the exposure to ultraviolet light takes place at the growth area with the highest TMAl flow rate, i.e., the interface region between n-$Al_{0.2}Ga_{0.8}As$ layers and n-$Al_{0.9}Ga_{0.1}As$ layers.

(2) Next, a $SiO_2$ layer 312 is formed on the surface of contact layer 208 employing atmospheric pressure CVD. Photoresist 313 is then applied on top of layer 312 after which a selective pattern is formed employing photolithography. At this time, the pattern conditions are such that the sides of the photoresist pattern are perpendicular to the surface of the substrate. After patterning, any heating is prevented that will cause the sagging of the photoresist layer sides to take place.

(3) Next, this pattern is placed on a mask and reactive ion etching (RIE) is applied employing $CF_4$ gas as the etching gas to remove the $SiO_2$ layer. Performing the operations for the required pattern as described above, it is possible to create photoresist 313 with layer sides that are perpendicular relative to the substrate as well as create a pattern employing the $SiO_2$ layer 312 (FIG. 10B).

(4) Next, photoresist 313 with the perpendicular sides will be made into a mask and etching will take place to leave a column shaped emitting section employing RIBE. At this time, p-$Al_{0.5}Ga_{0.5}As$ cladding layer 307 will be partially etched to form intervals between a plurality of columns that form the emission section (FIG. 10C). In this embodiment, a mixture of chlorine and argon gasses is employed as the etching gas, the gas pressure is $5 \times 10^{-4}$ Torr, and the plasma extraction voltage will be 400 volts. Based on sample etching, the ion current density will be 400 μA per square centimeter, with the sample temperature being maintained at 20° C.

Again, the reason p-type $Al_{0.5}Ga_{0.5}As$ cladding layer 307 is only partially etched is to provide the implanted carrier of the horizontal direction of the active layer and provide light confinement by means of a refractive index rib waveguide structure allowing a portion of the light in the active layer enabled in the horizontal direction of the active layer.

In addition, by using a photoresist 313 with perpendicular side surfaces with RIBE as the etching method, which etches by projecting an ion beam that is perpendicular to the etching sample, it is possible to spatially separated emitting sections 320, separated by means of vertical groove 314 on the substrate as well as to fabricate an efficient vertical optical resonator necessary for the improved surface emitting semiconductor laser.

(5) Next, a burying layer is formed on p-$Al_{0.5}Ga_{0.5}As$ cladding layer 307. For first purpose, photoresist 313 is removed and $ZnS_{0.06}Se_{0.94}$ layer 309 is grown by means of MBE or MOCVD (FIG. 10D).

(6) Next, the $SiO_2$ layer and the polycrystalline ZnSSe formed on top of it are removed. Next, four pairs of $SiO_2$/a-Si dielectric multiple layer reflection mirrors 311 are formed on the surface regions of cladding layer 308 employing electron beam deposition. A portion of the mirrors will then be selectively removed by dry etching utilizing RIE so that an area slightly smaller than the diameter of the emitting section remains (FIG. 10E). The reflection power of dielectric multiple layer mirror 311 is 95% or higher at a wavelength of 780 nm.

Because dielectric multiple layer mirrors 311 are also fabricated in the separation grooves 314 that are buried by $ZnS_{0.06}Se_{0.94}$ layer 309 of semiconductor laser 300, a perpendicular resonator structure is formed with constricted regions of the emitting section. As a result, light that leaks through spatial separation grooves contributes to the effectiveness of laser oscillation. Moreover, in phase operation is achieved in emitting section 320.

(7) Then, p-type ohmic electrodes 310 are deposited on surfaces other than dielectric multiple layer mirror 311. In addition, an n-type ohmic electrode 301 is deposited on substrate 302 (FIG. 10F). The p-type ohmic electrode 310 on the light exit side is fabricated so that it has continuity with each contact layer 308 of emitting section 320. Finally, alloying of these electrodes takes place in an $N_2$ atmosphere at 400° C.

Thus, as indicated relative to FIG. 9, it is possible to obtain a surface emitting semiconductor laser 300 with an emitting section 320 as described above. The $ZnS_{0.06}Se_{0.94}$ layer 309 has a resistance of one giga ohm or higher. Because there is no leakage of implant current to burying layer 309, an extremely effective current constriction is achieved. In addition, because it is not necessary to make burying layer 309 comprised of multiple layers, this layer can be easily fabricated with a high level of repeatability. Moreover, because this surface emitting semiconductor laser has a rib waveguide structure, there is a large difference in the refractive indices of active layer 306 below ZnS$_{0.06}$Se$_{0.94}$ layer 309 compared with the active resonator section, thereby concurrently allowing for the accomplishment of effective light confinement.

Because dielectric multiple layer mirrors 3 11 are also fabricated in the separation grooves 314 that are buried in the ZnS$_{0.06}$Se$_{0.94}$ layer of the semiconductor laser of this embodiment, a perpendicular resonator structure has also been formed for the constricted areas of the emitting section. As a result, the light that leaks through adjacent separation grooves contributes to the effectiveness of the laser oscillations. Moreover, because leakage light is being utilized, light emitting is synchronized for in phase operation in emitting section 320.

The results of the evaluation of a portion of the distributed Bragg reflection multiple layer mirrors employing SIMS are shown in FIG. 12. In FIG. 12, the vertical coordinate indicates the number of secondary ions of Al and Si, which correspond to the volume of atoms and number of carriers contained in the layer. The horizontal coordinate indicates the depth of the film thickness direction in part of the distributed reflection multiple layer mirrors. If FIG. 12 is compared with FIG. 11, it is obvious that there is a sharp increase in the Si concentration, an n-type dopant, in the layer at the point where ultraviolet light is projected providing a point of high carrier concentration. This is due to the following reasons. TMSi, which is a dopant material, is extremely stable thermally and undergoes thermal breakdown with difficulty. However, because the absorption band is in the ultraviolet region, it breaks down easily by being exposed to ultraviolet light. As a result, when comparing exposure to ultraviolet light to no exposure to ultraviolet light, the Si concentration of the growth layer sharply rises with exposure to ultraviolet light having the practical effect of an increasing in the amount of n-type dopant.

In addition, as a result of the increase in the carrier concentration of the interface region of the layers comprised of distributed Bragg reflection multiple layer mirrors 304, the walls of the conduction band become thin and the electrons easily undergo tunnel transfer. Therefore, there is a decrease in the electrical resistance in the vertical direction of these multiple layers. Also, because the only place that has an increase in carrier concentration due to the doping is the interface region and because the light irradiation contributes to the improvement of the film quality, there is no deterioration in film quality due to high dopant concentration.

The MOCVD apparatus employed in this embodiment is the same as that shown in FIG. 6. Ultraviolet light is obtained from excimer laser 601.

In this third embodiment, an example employing tetra methyl silane has been described. However, this invention is not limited to this material. The same effect can be achieved by employing a material in which thermal breakdown is difficult, in which there is absorption in the short wavelength band and in which breakdown is easily achieved employing the short wavelength light. Examples of the type of materials are tetra isobutyl silicon (C$_4$H$_9$)$_4$Si, tri isobutyl silicon hydride (C$_2$H$_5$)$_3$SiH and tri ethyl silane (C$_2$H$_5$)$_3$SiH. However, tetra methyl silane is preferred because it is easier to handle and its efficiency for optical breakdown.

Although there are some restrictions relative to the dopant materials, the method of this embodiment does not cause any changes in the flow of gas during growth when the amount of dopant is changed. Therefore, an extremely uniform epitaxial layer is obtained improving the properties and the yield of produced laser devices.

In each of the embodiments described above, a single manufacturing process has been described relative to particular dopants. However, this invention is not limited to these dopants. In addition, S, Se, Te, Si and Zn, C, Be, Mg and Ca may be effectively employed as dopants. When employing GaAs, dopant materials with low doping efficiency, such as Te or Mg, can have their doping profiles changed to achieve equivalent results to those described in relative to the foregoing embodiments. This is accomplished by controlling the flow of AsH$_3$, which is a Group V material, at the location where the high dopant concentration is desired in order to change the V/III ratio, which is the ratio used with the Group III material.

In all of the embodiments described above, a GaAlAs type surface emitting semiconductor laser was detailed. However, this can also be applied well to other Group III-V surface emitting semiconductor lasers. In particular, the oscillation wavelength of the active layer can be changed by changing the Al composition.

In addition, the burying layer is not limited to a ZnSSe compound layer. An equivalent effect can be obtained with a ZnS—ZnSe superlattice and with other Group II-VI compound semiconductors. For example, the equivalent effects can be achieved with ZnSe or ZnS or CdTe and their compounds, or superlattices of these materials can also be selected for the burying layer.

Also, the substrate need not be GaAs. Equivalent results can also be achieved employing other semiconductor substrates, such as, Si and InP or from dielectric substrates, such as, sapphire.

In the embodiments described above, examples of increasing the carrier concentration of the interface region of the layer side with large bandgap that composes the distributed Bragg reflection multiple layer mirror were given. However, this invention is not limited to this embodiment as the carrier concentration of the interface region of the layer with the small bandgap may also be increased. Alternatively, the carrier concentration of the interface regions between both the layer with the large bandgap and the small bandgap may be increased.

In particular, when a detailed investigation was made of the distribution of the carrier concentration, the reflection power of the multiple layer film, the resistance and the multiple layer film crystal characteristics of the vertical direction of the multiple layer film, it was necessary to make the thickness of the interface region with the increase in carrier concentration by ⅓ of the thickness of both the layer with the large bandgap and that with the small bandwidth. It was confirmed that the crystalline characteristics would deteriorate if the thickness was made greater than this amount.

Moreover, to achieve low resistance, it is desirable to have an instantaneous change in the volume of high concentration dopant and the volume of low concentration dopant. However, a slight deterioration in crystalline characteristics was seen depending on the doping material. In this case, a sharp change in the amount of dopant volume does not take place. If a mass flow controller is employed to make the doping change linearly or as a quadratic function or as a cubic function, in a time that is within ½ the time required to dope the interface region, the low resistance effect will be reduced slightly. However, the crystal characteristics will be prevented from deterioration.

As described in detail above, a highly efficient highly reliable semiconductor laser can be offered by making it possible to easily and accurately control the concentration of dopant in the interface region of a distributed Bragg reflection multiple layer mirror composed of low resistance reflection mirrors.

In addition, using the manufacturing process of this invention, it is possible to easily and accurately control the dopant concentration of the interface region of the distributed Bragg reflection multiple layer mirrors. It is also possible to offer a surface emitting semiconductor laser with excellent characteristics and excellent yield properties.

The surface emitting semiconductor laser of this invention is not only applicable for use in printing apparatus, such, as printers and copiers, it is also suitable as a light emitting source for telecommunications equipment, such as, facsimile machines and in laser operated displays.

While the invention has been described in conjunction with several specific embodiments, it is evident to those skilled in the art that many further alternatives, modifications and variations will be apparent in light of the forgoing description. Thus, the invention described herein is intended to embrace all such alternatives, modifications, applications and variations as may fall within the spirit and scope of the appended claims.

What is claimed is:

1. A surface emitting semiconductor laser that emits light in a vertical direction relative to a substrate and comprises:

a plurality of semiconductor layers epitaxially formed on said substrate, an optical resonator having a pair of spatially disposed reflecting mirrors with one adjacently positioned at a substrate side and with the other adjacent positioned at an upper surface side of said laser, at least one semiconductor layer formed between said mirrors forming a portion of said optical resonator, and at least one semiconductor layer having a portion thereof within said optical resonator and comprising at least one column formed in said portion, said at least one column vertically disposed relative to a longitudinal extent of said substrate;

a Group II-VI compound semiconductor epitaxial layer formed around said column semiconductor layer; and said substrate side mirror comprising a plurality of first layers of a Group III-V compound semiconductor and a plurality of second layers of a Group III-V compound semiconductor having a bandgap larger than that of said first layers, said first and second layers having different refractive indices and being alternately stacked;

said first and second layers doped during their growth with a predetermined carrier concentration; and the carrier concentration in an interface region between at least one pair of said first layer and said second layer being higher than the carrier concentration of all remaining portions of said first and second layers.

2. A surface emitting semiconductor laser that emits light in a vertical direction and comprises:

a plurality of semiconductor layers formed on said substrate, an optical resonator having a pair of spatially disposed reflecting mirrors with one adjacently positioned at a substrate side and with the other adjacent positioned at an upper surface side of said laser, at least one semiconductor layer formed between said mirrors forming a portion of said optical resonator, and at least one semiconductor layer having a portion thereof within said optical resonator and comprising at least one column formed in said portion, said at least one column vertically disposed relative to a longitudinal extent of said substrate;

a Group II-VI compound semiconductor layer formed around said column semiconductor layer; and said substrate side and said upper surface side mirrors comprising a plurality of first layers of a Group III-V compound semiconductor and a plurality of second layers of a Group III-V compound semiconductor having a bandgap larger than that of said first layers, said first and second layers having different refractive indices and being alternately stacked;

said first and second layers doped during their growth with a predetermined carrier concentration; and the carrier concentration in an interface region between at least one pair of said first layer and said second layer in at least one of said reflection mirrors being higher than the carrier concentration of all remaining portions of said first and second layers.

3. The surface emitting semiconductor laser in claim 2 wherein said first layers of said substrate side and said upper surface side mirrors are of the same Group III-V compound semiconductor and said second layers of said substrate side and said upper surface side mirrors are of the same Group III-V compound semiconductor.

4. The surface emitting semiconductor laser of claim 2 wherein said first layers of said substrate side and said upper surface side mirrors are of different Group III-V compound semiconductors and said second layers of said substrate side and said upper surface side mirrors are of different Group III-V compound semiconductors.

5. The surface emitting semiconductor laser of claim 4 wherein said different materials are, respectively, comprising Group III-V compound materials and Group IV material.

6. The surface emitting semiconductor laser in either claim 1, 2, 3 or 4 wherein a maximum value of carrier concentration in said interface region is a minimum of 1.1 times and within 100 times of the value of carrier concentration of regions other than said interface region.

7. The surface emitting semiconductor laser in either claim 1, 2, 3 or 4 wherein a maximum value of carrier concentration of said interface region is $5 \times 10^{20}$ cm$^{-3}$ or less.

8. The surface emitting semiconductor laser in any one of claims 1 through 3, or 4 wherein the thickness of said interface regions is within $\frac{1}{3}$ of the sum of the thicknesses of said first layers and second layers.

9. The surface emitting semiconductor laser in either claim 1, 2, 3 or 4 wherein a dopant employed in said interface region is S, Se, Te or Si in a case of forming a n-type region and is Zn, C, Be, Mg or Ca in a case of forming a p-type region.

10. A method of manufacturing a surface emitting semiconductor laser that emits light in a vertical direction, said laser formed on a substrate and comprising the steps of:

forming a plurality of semiconductor layers including a pair of spatially disposed reflection mirrors wherein at least one of said semiconductor layers formed between said mirrors comprises an optical resonator vertically disposed relative to a longitudinal extent of said substrate;

forming said reflection mirrors at a substrate side and at an upper surface side of said laser wherein said substrate side mirror comprising a plurality of first layers of a Group III-V compound semiconductor and a plurality of second layers of a Group III-V compound semiconductor that have a forbidden bandwidth that is larger than that of said first layers, said first and second layers having different refractive indices and being alternately stacked;

doping said first and second layers during their growth with a predetermined carrier concentration;

increasing the carrier concentration between adjacently stacked of at least one of said first and second layers during their growth so that the carrier concentration is higher at an interface between said at least one of said first and second layers compared to the carrier concentration in all remaining portions of said first and second layers;

forming a photoresist mask on said semiconductor layers;

etching at least one layer of said semiconductor layers to form at least one vertically disposed column comprising a portion of said vertically disposed optical resonator;

forming a Group II-VI compound semiconductor layer around said column semiconductor layer.

11. A method of manufacturing a surface emitting semiconductor laser that emits light in a vertical direction, said laser formed on a substrate and comprising the steps of:

epitaxially forming a plurality of semiconductor layers including a pair of spatially disposed reflection mirrors wherein at least one of said semiconductor layers formed between said mirrors comprises an optical resonator vertically disposed relative to a longitudinal extent of said substrate;

epitaxially forming said reflection mirrors at a substrate side and at an upper surface side of said laser wherein said substrate side reflection mirror comprises a plurality of first layers of a Group III-V compound semiconductor and a plurality of second layers of a Group III-V compound semiconductor that have a bandgap that is larger than that of said first layers, said first and second layers having different refractive indices and being alternately stacked;

doping said first and second layers during their growth with a predetermined carrier concentration;

increasing the carrier concentration between adjacently stacked of at least one of said first and second layers during their growth so that the carrier concentration is higher at an interface between said at least one of said first and second layers compared to the carrier concentration in all remaining portions of said first and second layers;

epitaxially forming said upper surface side reflection mirror comprising a plurality of third layers of a Group III-V compound semiconductor and a plurality of fourth layers of a Group III-V compound semiconductor that have a bandgap that is larger than that of said third layers, said third and fourth layers having different refractive indices and being alternately stacked;

doping said third and fourth layers during their growth with a predetermined carrier concentration;

increasing the carrier concentration between adjacently stacked of at least one of said third and fourth layers during their growth so that the carrier concentration is higher at an interface between said at least one of said third and fourth layers compared to the carrier concentration in all remaining portions of said third and fourth layers;

forming a photoresist mask on said semiconductor layers;

etching at least one layer of said semiconductor layers to form at least one vertically disposed column comprising a portion of said vertically disposed optical resonator;

forming a Group II-VI compound semiconductor layer around said column semiconductor layer.

12. The method of manufacturing of the surface emitting semiconductor laser of either claim 10 or 11 further comprising the step of instantaneously increasing the concentration of material employed for doping in said interface regions and the supply of material employed for doping in regions of said at least one of said first and second layers and said third and fourth layers other than said interface regions during the growth of said at least one of said first and second layers and said third and fourth layers.

13. The method of manufacturing of the surface emitting semiconductor laser of either claim 10 or 11 further including the step of monotonically increasing the concentration of material employed for doping during the growth of said interface regions and monotonically increasing the concentration the supply of material employed for doping during the growth of regions of said at least one of said first and second layers and said third and fourth layers other than said interface regions, the monotonical increase of said doping concentration during the growth of said regions other than said interface regions being accomplished within ½ the time taken for doping said interface regions.

14. A method of manufacturing a surface emitting semiconductor laser that emits light in a vertical direction, said laser formed on a substrate and comprising the steps of:

forming a plurality of semiconductor layers including a pair of spatially disposed reflection mirrors wherein at least one of said semiconductor layers formed between said mirrors comprises an optical resonator vertically disposed relative to a longitudinal extent of said substrate;

forming said reflection mirrors on substrate side and upper surface side of said laser wherein said substrate side mirror having a plurality of first layers of a Group III-V compound semiconductor and a plurality of second layers of a Group III-V compound semiconductor that have a bandgap that is larger than that of said first layers, said first and second layers having different refractive indices and being alternately stacked;

doping said first and second layers during their growth with a predetermined carrier concentration;

increasing the carrier concentration between adjacently stacked of at least one of said first and second layers through exposure to light during the growth at said interface region so that the carrier concentration is higher at an interface between said at least one of said first and second layers compared to the carrier concentration in all remaining portions of said first and second layers;

forming a photoresist mask on said semiconductor layers;

etching at least one layer of said semiconductor layers to form at least one vertically disposed column comprising a portion of said vertically disposed optical resonator;

forming a Group II-VI compound semiconductor layer around said column semiconductor layer.

15. A method of manufacturing a surface emitting semiconductor laser that emits light in a vertical direction, said laser formed on a substrate and comprising the steps of:

epitaxially forming a plurality of semiconductor layers including a pair of spatially disposed reflection mirrors wherein at least one of said semiconductor layers formed between said mirrors comprises an optical resonator vertically disposed relative to a longitudinal extent of said substrate;

epitaxially forming said reflection mirrors at a substrate side and at an upper side of said laser wherein said reflection mirrors comprise a plurality of first layers of a Group III-V compound semiconductor and a plurality of second layers of a Group III-V compound semiconductor that have a bandgap that is larger than that of said first layers, said first and second layers having different refractive indices and being alternately stacked;

doping said first and second layers during their growth with a predetermined carrier concentration;

increasing the carrier concentration between adjacently stacked of at least one of said first and second layers through exposure to light during the growth at said interface region so that the carrier concentration is higher at an interface between said at least one of said first and second layers compared to the carrier concentration in all remaining portions of said first and second layers.

16. The manufacturing process of the surface emitting semiconductor laser of either claim 14 or 15 wherein tetra methyl silane is employed as a doping material for providing said carrier concentration during the growth of said reflection mirrors.

17. The manufacturing process of the surface emitting semiconductor laser of any one of claims 10, 11, 14, and 15 including the step of changing the ratio of Group III material and Group V material in said Group III-V compound semiconductor at said interface regions while simultaneously increasing the carrier concentration at said interface region.

18. A surface emitting semiconductor laser that emits light in a vertical direction relative to a substrate and comprises:

a plurality of semiconductor layers epitaxially formed on said substrate, an optical resonator having a pair of spatially disposed reflecting mirrors with one adjacently positioned at a substrate side and with the other adjacent positioned at an upper surface side of said laser, at least one semiconductor layer formed between said mirrors forming a portion of an active region for generating light under lasing conditions, and another semiconductor layer spatially adjacent to said active region and having a lower index of refraction than said active region, a portion of the depth of said another semiconductor layer removed except for a substantially central column portion and a burying layer formed around said column portion and comprised of a material having higher resistance and a lower index of refraction than said another semiconductor layer wherein said central portion and remaining portion of said another semiconductor layer comprises a rib waveguide forming a columnar-shaped, transversely disposed optical cavity comprising a portion of said optical resonator.

19. The surface emitting semiconductor laser of claim 18 wherein said burying layer comprises ZnSSe, ZnSe, ZnS, CdTe or their compounds.

20. The surface emitting semiconductor laser of claim 18 wherein said burying layer comprises a ZnS—ZnSe superlattice.

21. The method of manufacturing of the surface emitting semiconductor laser of either claim 10 or 11 further including the step of monotonically increasing as a quadratic function the concentration of material employed for doping during the growth of said interface regions and monotonically increasing as a quadratic function the concentration the supply of material employed for doping during the growth of regions of said at least one of said first and second layers and said third and fourth layers other than said interface regions, the monotonical increase of said doping concentration during the growth of said regions other than said interface regions being accomplished within ½ the time taken for doping said interface regions.

22. The method of manufacturing of the surface emitting semiconductor laser of either claim 10 or 11 further including the step of monotonically increasing as a cubic function the concentration of material employed for doping during the growth of said interface regions and monotonically increasing as a cubic function the concentration the supply of material employed for doping during the growth of regions of said at least one of said first and second layers and said third and fourth layers other than said interface regions, the monotonical increase of said doping concentration during the growth of said regions other than said interface regions being accomplished within ½ the time taken for doping said interface regions.

23. The method of manufacturing of the surface emitting semiconductor laser of either claims 14 or 15 wherein said exposure to light comprises ultraviolet light.

24. A method of manufacturing a surface emitting semiconductor laser that emits light in a vertical direction, said laser formed on a substrate and comprising the steps of:

forming a plurality of semiconductor layers including at least one reflection mirror wherein at least one of said semiconductor layers formed relative to said mirrors comprises an optical resonator vertically disposed relative to a longitudinal extent of said substrate;

forming said reflection mirror comprising of a plurality of first layers of a Group III–V compound semiconductor and a plurality of second layers of a Group III–V compound semiconductor that have a bandgap that is larger than that of said first layers, said first and second layers having different refractive indices and being alternately stacked;

doping said first and second layers during their growth with a predetermined carrier concentration; and increasing the carrier concentration between adjacently stacked of at least one of said first and second layers during the growth at said interface region so that the carrier concentration is higher at an interface between said at least one of said first and second layers compared to the carrier concentration in all remaining portions of said first and second layers.

25. The method of manufacturing the surface emitting semiconductor laser of claim 24 including the steps of:

removing a portion of the semiconductors from an upper surface of said plurality of semiconductor layers leaving a substantially central column of said plurality of semiconductor layers comprising a portion of said optical resonator; and forming a II–VI compound layer having a high resistance level around said column and together with a remaining portion of removed semiconductor layer forming a rib waveguide for current and light confinement relative to said column.

26. A method of manufacturing a surface emitting semiconductor laser that emits light in a vertical direction, said laser formed on a substrate and comprising the steps of:

forming a plurality of semiconductor layers including a pair of spatially disposed reflection mirrors wherein at least one of said semiconductor layers formed between said mirrors comprises an optical resonator vertically disposed relative to a longitudinal extent of said substrate;

forming said reflection mirrors at a substrate side and at an upper surface side of said laser wherein one of said reflection mirrors comprises a plurality of first layers of a compound semiconductor material and a plurality of second layers of another compound semiconductor material that have a bandgap that is larger than that of said first layers, said first and second layers having different refractive indices and being alternately stacked, and wherein the other of said reflection mirrors comprises a plurality of first layers of a first dielectric material and a plurality of second layers of second dielectric material;

doping said first and second layers during their growth with a predetermined carrier concentration;

increasing the carrier concentration between adjacently stacked of at least one of said first and second layers of said one reflection mirrors during the growth at said interface region so that the carrier concentration is higher at an interface between said at least one of said first and second layers compared to the carrier concentration in all remaining portions of said first and second layers of said one reflection mirrors.

27. A surface emitting semiconductor laser that emits light in a vertical direction and comprises:

a plurality of semiconductor layers formed on said substrate, an optical resonator having a pair of spatially disposed reflecting mirrors with one adjacently positioned at a substrate side and with the other adjacent positioned at an upper surface side of said laser, at least one semiconductor layer formed between said mirrors forming a portion of said optical resonator, and at least one semiconductor layer having a portion thereof within said optical resonator and comprising at least one column formed in said portion, said at least one column vertically disposed relative to a longitudinal extent of said substrate;

a layer of material formed around said column semiconductor layer and having a lower refractive index than said at least one column; and said substrate side mirror comprising a plurality of first layers of a Group III–V compound semiconductor and a plurality of second layers of a Group III–V compound semiconductor having a bandgap larger than that of said first layers, said first and second layers having different refractive indices and being alternately stacked;

said first and second layers doped during their growth with a predetermined carrier concentration; and the carrier concentration in an interface region between at least one pair of said first layer and said second layer of said substrate side mirror being higher than the carrier concentration of all remaining portions of said first and second layers.

28. The surface emission semiconductor laser of claim 27 wherein a maximum value of carrier concentration in said interface region is a minimum of 1.1 times and within 100 times of the value of carrier concentration of regions other than said interface region.

29. The surface emission semiconductor laser of claim 27 wherein a maximum value of carrier concentration of said interface region is $5 \times 10^{20}$ cm$^{-3}$ or less.

30. The surface emitting semiconductor laser of claim 27 wherein the thickness of said interface region is within $\frac{1}{3}$ of the sum of the thicknesses of said first layers and second layers.

31. The surface emission semiconductor laser of claim 27 wherein a dopant employed in said interface region is S, So, Te or Si in a case of forming a n-type region and is Zn, C, Be, Mg or Ca in a case of forming a p-type region.

32. The surface emitting semiconductor laser of claim 27 wherein said first and second layers of said substrate side mirror are of different Group III–V compound semiconductors.

33. The surface emitting semiconductor laser of claim 27 wherein said layer of material formed around said column semiconductor layer is a Group II–VI compound semiconductor layer.

* * * * *